United States Patent [19]

Shahvandi et al.

[11] Patent Number: 5,405,491
[45] Date of Patent: Apr. 11, 1995

[54] PLASMA ETCHING PROCESS

[75] Inventors: Iraj E. Shahvandi, Round Rock; Carol Gelatos; Leroy Grant, Jr., both of Austin, all of Tex.

[73] Assignee: Motorola Inc., Schaumburg, Ill.

[21] Appl. No.: 205,449

[22] Filed: Mar. 4, 1994

[51] Int. Cl.⁶ .................... H01L 21/306; B44C 1/22
[52] U.S. Cl. ..................... 156/643; 156/656; 156/345
[58] Field of Search ............. 156/643, 646, 656, 657, 156/659.1, 662, 345; 204/298.31, 298.33, 298.37, 298.38, 298.39, 192.32, 192.37; 118/715, 723, 728, 732, 719

[56] References Cited

U.S. PATENT DOCUMENTS

| | | | |
|---|---|---|---|
| 5,262,029 | 11/1993 | Erskine et al. | 156/345 X |
| 5,292,399 | 3/1994 | Lee et al. | 156/643 |
| 5,304,248 | 4/1994 | Cheng et al. | 118/728 |

OTHER PUBLICATIONS

Applied Materials, Inc., Cross Sectional View of Process Chamber: AMAT 5000, Jul. 21, 1991.
Applied Materials, Inc., Process Kit For Clamping Mechanism, Jul. 21, 1991.

*Primary Examiner*—William Powell
*Attorney, Agent, or Firm*—Jasper W. Dockrey

[57] ABSTRACT

A process for fabricating a semiconductor device is enhanced by providing a plasma etching process in which exposed metal surfaces within a plasma etching chamber (24) are protected by a ceramic layer (46). In the plasma etching process, a substrate (10) is placed on a platen (26) located within a plasma etching apparatus (22). A clamping device (40) secures the perimeter of the substrate (10) to the platen (26). The clamping device (40) includes a ceramic layer (46) overlying a metal base (44). When a plasma is ignited within the etching chamber (24), the ceramic layer (46) prevents physical contact of the plasma and the metal base (44) of the clamping device (40).

11 Claims, 2 Drawing Sheets

PLASMA ETCHING PROCESS

FIELD OF THE INVENTION

This invention relates in general to a process for fabricating a semiconductor device, and more particularly to a plasma etching process.

BACKGROUND OF THE INVENTION

The fabrication of extremely complex, high-density integrated circuit has been made possible through advances in integrated circuit fabrication technology. Fabrication technology now exists having the capability to define circuit components having feature sizes in the sub-micron size range. For example, new lithographic techniques have been developed using X-ray and pulse-laser energy sources. Additionally, thin-film deposition technology now exists with the capability to form thin-films having precisely determined metallurgical compositions and thicknesses. Furthermore, thin-film deposition techniques have been developed which are capable of selectively depositing metals in precisely defined locations during device fabrication.

In accordance with the development of new lithographic and film deposition techniques, plasma etching technology has rapidly advanced to provide the etching capability necessary to transfer the high-resolution lithographic patterns to the underlying thin-films. The difficulty of etching a high-resolution pattern has been compounded by the development of semiconductor device components requiring multiple layers of metals having different structural compositions. Often, an etching gas ideally suited to the plasma etching of a specified metal, or family of structurally similar metals, is not effective for etching an underlying metal. This problem is most distinctly illustrated in the fabrication of metallized contact structures for high-performance semiconductor devices. For example, multi-layer metal devices are interconnected by refractory-metal via plugs. To prevent the inter diffusion of refractory-metal components, and to improve the adhesion of the refractory metal, metal adhesion layers are typically employed underlying the refractory-metal. Depending upon the material composition of the refractory-metal and the adhesion metal, completely different etching chemistries must be employed to pattern the composite metal structure.

Advanced plasma etching systems having the capability of generating different plasma chemistries are commonly employed to etch multiple layers of metal having different structural compositions. The advanced plasma etching systems have either the capability of performing plasma etching in several internal etching chambers, or provide a single etching chamber having electrical, mechanical, and gas delivery capability necessary for the generation of a variety of plasmas. Thus, advanced plasma etching equipment provides process capability to transfer high resolution patterns to multi-layer metallization structures.

While the advanced systems initially provide the capability for etching a variety of metals, this capability requires that the plasma etching systems be extremely complex. In the construction of etching chambers, a wide variety of materials are used to construct the various electrical and mechanical elements necessary for the transfer of substrates into the etching chambers. Additionally, other components such as fixtures, gas seals, and fittings, and the like, must also be present to provide complex processing capability. Many of the components internal to a plasma etching chamber are fabricated from metals having similar structural compositions to those commonly used in semiconductor devices. Additionally, many of the structural components are fabricated from polymer materials, such as high density plastics.

During the plasma etching process, the internal components of a plasma etching chamber are necessarily exposed to the reactive plasma. The chemical components of the plasma react with all surfaces exposed to the plasma, including the surfaces of the internal components of the plasma etching chamber. In addition to causing component wear, the plasma also generates particulate matter as it reacts with the internal components of the plasma etching chamber. The particulate matter is redeposited on the wall surfaces of the chamber, as well as the surface of the semiconductor substrate being etched. The particle generation and wear problems are compounded with the use of different plasma chemistries to etch the different metals present in the semiconductor device. By increasing the number of different plasma chemistries used in an etching chamber, the exposure of the chamber to plasmas having different etching characteristics results in even more wear and particulate generation. The various chemical components of the different plasmas selectively attack the various materials present inside the etching chamber.

In the fabrication of high-density semiconductor devices, it is essential that particle contamination be held to an absolute minimum. Furthermore, the processing equipment used to fabricate the devices must be available to perform etching operations on a 24 hour basis. The combination of a low particulate level and high equipment availability produces high chip-yield and reduced fabrication cycle time. To meet the need for lower particulate levels and improved equipment availability, advances in process technology are necessary for the fabrication of complex, composite metal structures.

SUMMARY OF THE INVENTION

In practicing the present invention there is provided a process for fabricating a semiconductor device, in which an improved plasma etching process is realized by minimizing chemical reactions between an etching plasma and internal components of a plasma etching apparatus. In one embodiment of the invention, a semiconductor substrate is positioned on a platen located within a plasma etching apparatus. A clamping device is positioned to secure the perimeter of the substrate to the platen. The clamping device includes a ceramic layer overlying a metal base. The plasma is ignited within the plasma etching apparatus, however, the ceramic layer prevents the physical contact of the plasma and the metal base. By preventing the contact of the plasma and the metal base of the clamping device, the uniformity of the plasma within the plasma etching apparatus is improved. In addition, the generation of particulates during the plasma etching process is minimized.

Figure 1:
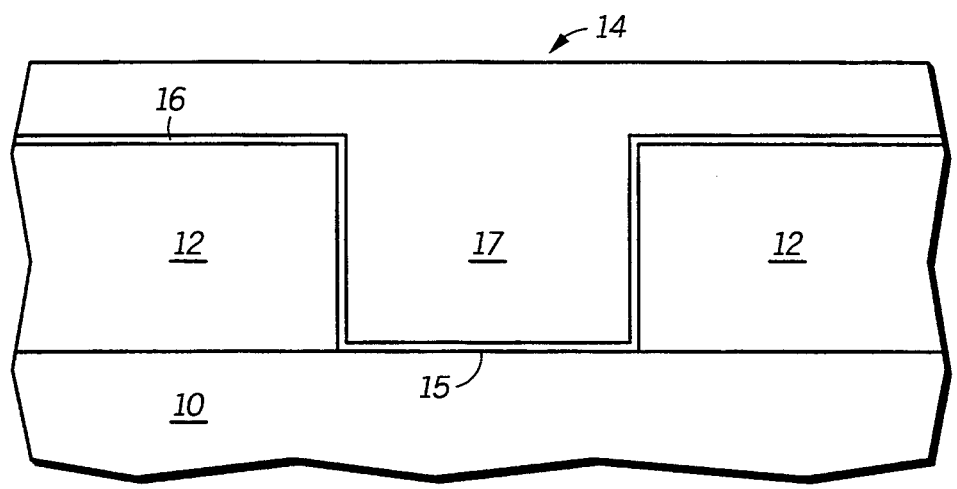
FIG. 1 illustrates, in cross-section, a portion of a semiconductor device during fabrication of a metallized contact structure.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

In the processing of semiconductor devices, plasma etching processes are used in several stages of the fabrication sequence. Typically, plasma etching processes are used to remove both insulating materials and electrically conductive materials, and to define geometric patterns of these materials on a semiconductor substrate. The plasma etching process is carried out with highly reactive gases, which are capable of etching not only the materials on the semiconductor substrate, but also the materials within the plasma etching apparatus itself. The unwanted etching of materials within the plasma reactor can generate high levels of particulate contamination. The particles, generated by the reaction of plasma etching gases with the internal components of the plasma etching system, can deposit on the surface of the semiconductor substrate and impair or destroy the functionality of the semiconductor device.

The present invention reduces the particle generation associated with the reaction of plasma etching gases and the internal components of a plasma etching apparatus. The reduced particulate generation is achieved by covering metal surfaces exposed to the plasma with an unreactive material. In one embodiment of the invention, the metal portions of a clamping device used to secure the perimeter of the substrate to a platen within the etching apparatus is covered with a nonreactive ceramic layer. By preventing the reaction of plasma etching gases with the metal portions of the clamping device, the amount of particulates generated during the plasma etching process is substantially reduced. The reduction in particulate generation during the plasma etching process improves both the manufacturing efficiency of the plasma etching process and the functional yield of the semiconductor devices after fabrication.

Figure 2:
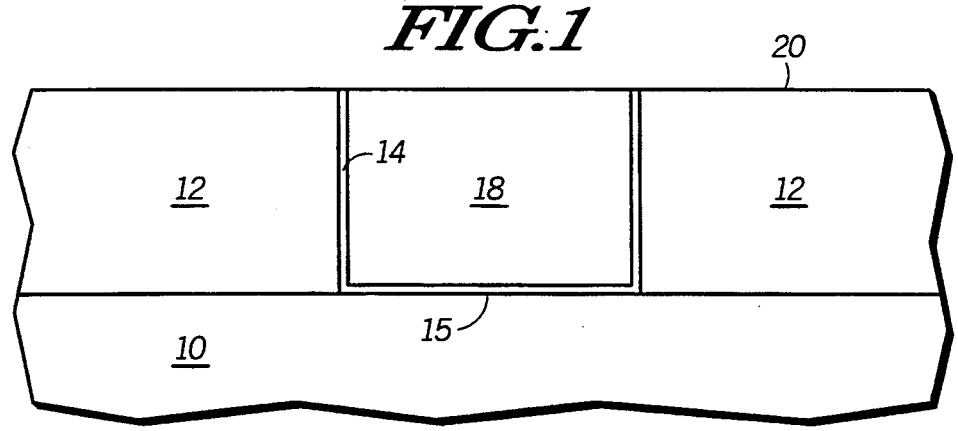
FIG. 2 illustrates, in cross-section, a via plug and a planar surface formed by a plasma etching process performed in accordance with the invention.

FIGS. 1 and 2 illustrate, in cross-section, the fabrication of a metallized contact structure. Shown in FIG. 1 is a portion of a semiconductor substrate 10 having a dielectric layer 12 thereon. Dielectric layer 12 has an opening 14 exposing a surface portion 15 of substrate 10. A metal interlayer 16 overlies the surface of dielectric layer 12 and surface portion 15. A metal-via layer 17 overlies metal interlayer 16 and fills opening 14. Interlayer 16 adheres metal-via layer 17 to dielectric layer 12, and to surface portion 15. Interlayer 16 also provides a diffusion barrier between metal-via layer 17 and surface portion 15. Metal interlayer 16 is preferably a composite material, which includes a layer of titanium nitride overlying a layer of titanium. The titanium layer provides an adhesive film for adhering the metal-via layer to the dielectric layer and to the substrate, while the titanium nitride layer provides a diffusion barrier. Preferably, metal-via layer is a refractory-metal layer, such as tungsten.

During the tungsten deposition process, the titanium nitride component of interlayer 16 prevents components of the source gas used in the tungsten deposition process from attacking substrate 10 at surface portion 15. Depending upon the exact composition of metal-via layer 17, other materials and combinations of materials can be used to form interlayer 16. For example, interlayer 16 can be a multi-layer composite including titanium, titanium nitride, and other metals, such as aluminum, tantalum, copper, and the like. Additionally, metal-via layer 17 can be titanium-tungsten, copper, tantalum, and the like.

In accordance with the invention, following the deposition of metal-via layer 17, a plasma etching process is performed to form a via plug 18. During the plasma etching process, portions of via-layer 17 overlying the surface of dielectric layer 12 are etched away. Additionally, portions of interlayer 16 overlying the surface of dielectric layer 12 are also removed, such that a planar surface 20 is formed.

The formation of via plug 18 and planar surface 20 requires the plasma etching of both the refractory-metal of via-layer 17, and the metal components of interlayer 16. In the case where via-layer 17 is tungsten and interlayer 16 is a composite of titanium nitride and titanium, different plasma etching chemistries are required to etch these metals. For example, fluorinated etching gases are typically used to etch refractory metals such as tungsten. Preferably, highly reactive fluorinated gas, such as sulfurhexafluoride, is employed to rapidly react with the tungsten of metal-via layer 17. Alternatively, fluorinated hydrocarbon gases can be used, such as fluoromethane, difluoroethane, and the like. Additionally, fluorine gas can also be used.

While fluorinated etching gas can be effectively used to remove the refractory-metals of metal-via layer 17, chlorinated gases must be used to etch the metal composition of interlayer 16. For example, chlorine gas can be used to etch interlayer components, such as titanium, titanium nitride, and other refractory-metal nitride layers. Alternatively, other chlorinated gases, such as chlorinated hydrocarbon gases, hydrogen chloride, and carbon tetrachloride can also be used. Examples of suitable chlorinated hydrocarbon gases include dichlorodifluoromethane, methylenechloride, and the like.

To obtain both a short fabrication time, and to avoid exposure of the substrate during the fabrication of metallized contact structures, the formation of via plug 18 is completed by the sequential etching of the metal layers in a single plasma processing step. By sequentially etching metal-via layer 17, then interlayer 16 in a single plasma etching step, exposure of the metal layers to environmental contamination prior to completion of the via forming process is avoided. During the fabrication of metallized contact structures, it is important that electrically resistive oxide layers not be formed in any region of the contact structure. Since metal-via materials, such as tungsten, rapidly react with oxygen to form a refractory-metal oxide film, it is especially important that tungsten not be exposed to oxygen during the fabrication of via plug 18. Accordingly, the optimum process for the fabrication of via plug 18 requires that substrate 10 remain within the inert environment of a plasma etching apparatus during the fabrication of the via plug.

Those skilled in the art will appreciate that many commercially available plasma etching systems contain plasma etching chambers housing components constructed from metals similar to those used in the fabrication of semiconductor devices. Although the etching chamber itself is typically constructed of stainless steel, which is relatively inert to many common etching gases, other components such as clamping mechanisms and substrate transfer mechanisms are constructed of materials such as aluminum. Aluminum is highly reactive with chlorinated etching gases and is readily etched by a chlorine plasma. Additionally, fluorinated etching gases will react with many polymer materials, which are also used in the construction of clamping mechanisms and substrate transfer mechanisms.

Figure 3:
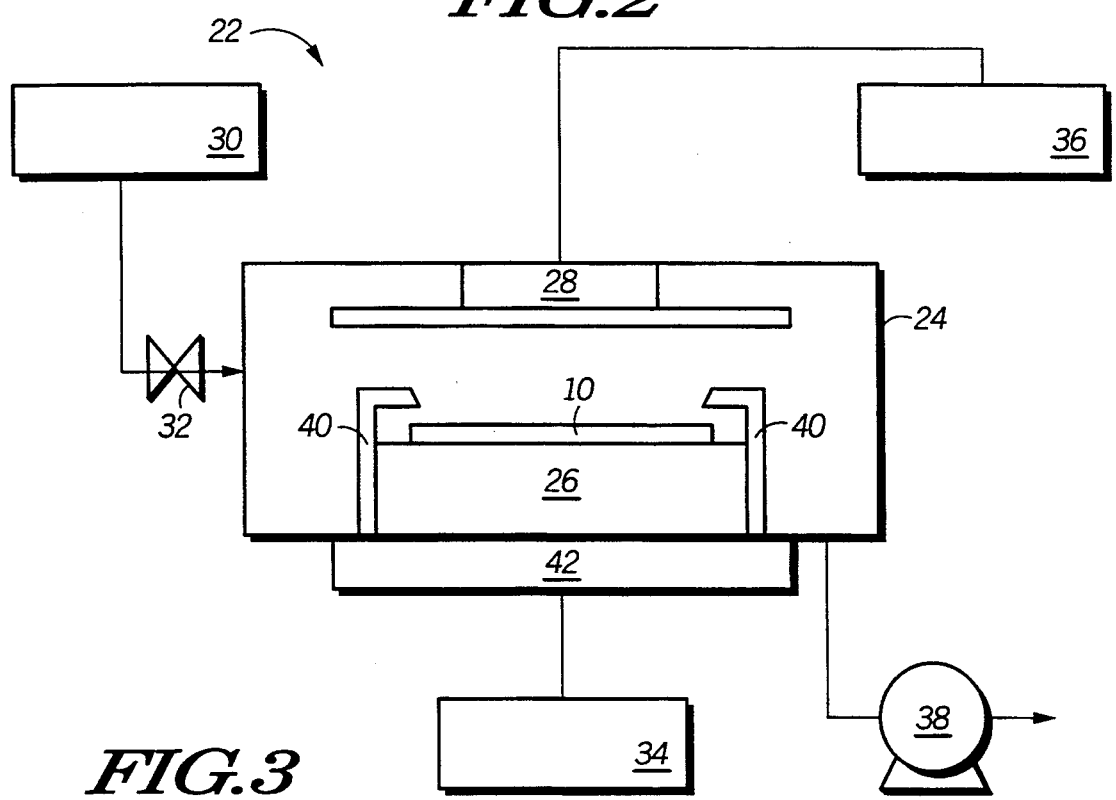
FIG. 3 illustrates a schematic diagram of a plasma etching apparatus arranged in accordance with one embodiment of the invention.

An exemplary plasma etching apparatus 22 is illustrated in the schematic diagram shown in FIG. 3. Plasma etching apparatus 22 includes an etching chamber 24 housing a platen 26 and an upper electrode 28. Platen 26 functions both as a lower electrode and as a support surface for semiconductor substrate 10. Etching gases are introduced into etching chamber 24 by a gas supply system 30 and a mass flow controller system 32. An RF power supply 34 including a matching network supplies RF power to platen 26. A DC bias power supply 36 provides a bias voltage between upper electrode 28 and platen 26. A pumping system 38 regulates the internal pressure within etching chamber 24. Also housed within etching chamber 24 is a clamping device 40. Clamping device 40 is actuated by an engaging system 42.

Clamping device 40, when engaged by engaging system 42, secures a perimeter portion of substrate 10 to platen 26. The clamping action provided by clamping device 40 insures good electrical contact between substrate 10 and platen 26. In addition, clamping device 40 prevents lateral motion of substrate 10 on the surface of platen 26 during the plasma etching process.

In the plasma etching systems of the prior art, the clamping devices contain aluminum components having metal surfaces exposed to the plasma, while the clamping device is engaged securing a substrate to the platen. The clamping devices of the prior art further include a polymer focusing ring positioned over an aluminum clamping ring. During a plasma etching process, the polymer material of the focus ring and the aluminum material of the clamping ring were both etched, by either the fluorinated etching gases or by chlorinated etching gases. Therefore, the polymer focus ring and the exposed aluminum of the clamping device led to high particle contamination levels and frequent cleaning maintenance.

Figure 4:
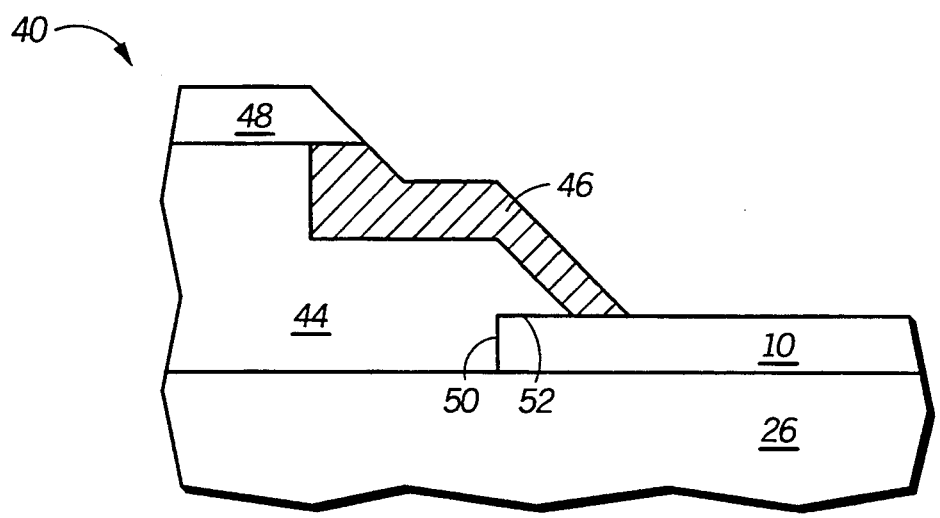
FIG. 4 illustrates, in cross-section, a portion of a clamping device constructed in accordance with the invention.

A clamping device 40, arranged in accordance with one embodiment of the invention, is illustrated in FIG. 4. Clamping device 40 includes a metal base 44 and a ceramic layer 46 overlying the metal base. A ceramic focus ring 48 overlies a portion of ceramic layer 46 and a portion of the metal base 44. Clamping device 40 is illustrated in an engaged position securing a perimeter portion of substrate 10 to platen 26.

Clamping device 40 makes physical contact to substrate 10 at a side portion 50 and a top portion 52. The direct contact between metal base 44 and side portion 50 and top portion 52 provides a charge conduction path between substrate 10 and platen 26. By providing a charge conduction path between substrate 10 and platen 26, excessive buildup of electrical potential on the surface of substrate 10 is minimized. Plasma etching parameters, such as etching uniformity and anisotropy, are best maintained where excessive buildup of electrical charge on the surface of substrate 10 is minimized. Ceramic layer 46 is configured to overlie metal base 44, such that the metal surfaces of metal base 44 are protected from exposure to the plasma within etching chamber 24, yet expose surface regions of metal base 44 which engage substrate 10. Thus, the particular construction of ceramic layer 46 and metal base 44 enables clamping device 40 to engage substrate 10 and provide a charge conduction path, while avoiding reaction between plasma gases and metal base 44.

In addition to a precisely configured ceramic layer protecting metal base 44, focus ring 48 is constructed of a thin ceramic material which is also unreactive with etching plasmas. As depicted in FIG. 4, focus ring 48 couples to ceramic layer 46 such that sharp corners having angles near 90 degrees are avoided. The absence of 90 degree angles in regions of ceramic layer 46 exposed to the plasma is also depicted in FIG. 4. The absence of edges having angles at or near 90 degrees is important to minimize the occurrence of high electric fields in localized regions within the plasma. It is known that electric field lines concentrate on sharp edges and protuberances within a plasma. The concentration of field lines can be minimized by reducing sharp angles on machine components exposed to the plasma. This is especially important for machine components which reside close to the substrate surface during the plasma etching process. High electric fields near the surface of the substrate can cause etching nonuniformity by disturbing the electric field near the substrate.

EXAMPLE

To carry out the process of the invention, substrate 10 having the metallized structure illustrated in FIG. 1, is positioned on platen 26 in etching apparatus 22. Etching chamber 24 is evacuated by pumping system 38 to a pressure of about 260 millitorr. Gases are introduced from gas supply system 30 through mass flow controller system 32 to stabilize the pressure within etching chamber 24, and to purge chamber 24 of any atmospheric gases. Initially, about 110 sccm of sulfurhexafluoride, about 90 sccm of argon, and about 5 sccm of helium are introduced. Once the pressure is stabilized, about 375 watts of RF power is applied to the electrodes by RF power supply 34, and a bias voltage ranging from about $-1000$ volts to 0 volts is applied by DC bias power supply 36. The etching of metal-via layer 17 is then carried out for a predetermined period of time depending upon the deposited thickness of metal-via layer 17, and the particular etch rate obtained under the stated conditions. Once the predetermined etch time is complete, the RF power is turned off and the flow of etching gases is terminated. The chamber is then evacuated completely by pumping system 38.

The etching of interlayer 14 begins by flowing about 60 sccm of chlorine, about 50 sccm of argon, and about 20 sccm of helium. A plasma is ignited by applying 300 watts of RF power from power supply 34, and applying about $-1000$ volts to 0 volts of DC bias. The completion of the etching process for the removal of interlayer 16 is determined by means of an optical end-point system (not shown).

The process carried out in accordance with the foregoing example results in the rapid and uniform removal of metal layers 17 and 16, while minimizing the generation of particulate contamination in etching chamber 24. Additionally, by minimizing particulate generation during the etching process the amount of time which the system may be operated between cleaning procedures is increased. By reducing the frequency of chamber cleaning operations, the availability of the etching system for performing plasma etching operations is increased. In addition to lowering production costs, the improved availability of the etching system decreases the process time necessary to fabricate semiconductor devices.

Although the process of the invention has been illustrated with respect to a metallized contact structure as illustrated in FIGS. 1 and 2, those skilled in the art will appreciate that the advantages of the invention can be realized in the fabrication of numerous device components. For example, substrate 10, as illustrated in FIGS. 1 and 2 can include a metal layer overlying numerous device components, and via plug 18 can be used to interconnect overlying metal interconnect layers to substrate 10. Furthermore, other materials requiring fluorinated and chlorinated etching gases can be etched with the process of the invention to obtain the advantages described herein. For example, polysilicon can be etched using chlorinated etching gases to form device structures such as an MOS gate electrode, resistor structures, portions of contact structures, and the like.

Thus it is apparent that there has been provided, in accordance with the invention, a method for plasma etching a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the configuration of the plasma etching system can differ substantially from that illustrated. In addition, other components within the plasma etching chamber can be coated or covered with a ceramic layer to prevent contact of reactive surfaces to the plasma. It is therefore intended to include within the invention all such variations and modifications as fall within the scope of the appended claims and equivalents thereof.

We claim:

1. A process for fabricating a semiconductor device comprising the steps of:
   providing a semiconductor substrate;
   positioning the substrate on a platen located within a plasma etching apparatus;
   positioning a clamping device to secure the perimeter of the substrate to the platen,
   wherein the clamping device includes a ceramic layer overlying a metal base; and
   igniting a plasma within the etching apparatus,
   wherein the ceramic layer prevents physical contact of the plasma and the metal base.

2. The process of claim 1, wherein the step of igniting a plasma comprises flowing reactive gases into the etching apparatus, wherein the reactive gases are selected from the group consisting of fluorine, fluorinated hydrocarbon, sulfur hexafluoride, chlorine, chlorinated hydrocarbon, and hydrogen chloride.

3. The process of claim 1, wherein the substrate supports a metal layer, and wherein the metal layer is etched by the plasma.

4. The process of claim 3, wherein the metal layer is selected from the group consisting of a refractory metal, a refractory metal nitride, a refractory metal silicide, aluminum, copper, and an alloy of aluminum and copper.

5. The process of claim 1, wherein the step of positioning a clamping device comprises contacting the metal base to a side portion and a top portion of the substrate, such that a charge conduction path is provided between the substrate and the metal base.

6. A process for fabricating a semiconductor device comprising the steps of:
   providing a plasma etching apparatus;
   providing a semiconductor substrate having a metal layer thereon;
   positioning the substrate on a platen within the etching apparatus;
   engaging a clamping device to secure the substrate to the platen, wherein the clamping device includes a ceramic layer overlying an aluminum base, and a ceramic focus ring overlying a portion of the aluminum base and a portion of the ceramic layer;
   flowing etching gas into the etching apparatus; and
   igniting a plasma to etch the refractory-metal layer, wherein the ceramic layer prevents the reaction of the etching gas with the aluminum base.

7. The process of claim 6, wherein the step of providing a substrate having a metal layer comprises providing a refractory metal layer overlying a refractory-metal nitride layer, and wherein the process further comprises flowing fluorinated etching gas into the etching apparatus to etch the refractory-metal layer, and flowing chlorinated etching gas into the etching apparatus to etch the refractory-metal nitride layer.

8. The process of claim 6, wherein the step of engaging a clamping device comprises contacting the aluminum base to a side portion and a top portion of the substrate, such that a charge conduction path is provided between the substrate and the aluminum base.

9. A process for fabricating a semiconductor device comprising the steps of:
   providing a substrate having metallized contact structure, the structure including,
   a dielectric layer having an opening therein, a metal interlayer overlying the dielectric layer, and a metal-via layer overlying the metal interlayer and filling the opening;
   positioning the substrate on a platen located within a plasma etching apparatus;
   engaging a clamping device to secure the perimeter of the substrate to the platen,
   wherein the clamping device includes a ceramic layer overlying a metal base;
   flowing fluorinated etching gas into the etching apparatus to etch the metal-via layer; and
   flowing chlorinated etching gas into the etching apparatus to etch the metal interlayer,
   wherein the ceramic layer prevents reaction of the fluorinated and chlorinated etching gases with the metal base.

10. The process of claim 9, wherein the step of flowing fluorinated etching gas comprises flowing a gas selected from the group consisting of fluorine, fluorinated hydrocarbon, sulfur hexafluoride, and wherein the step of flowing chlorinated etching gas comprises flowing a gas selected from the group consisting of chlorine, chlorinated hydrocarbon, and hydrogen chloride.

11. The process of claim 9, wherein the step of engaging a clamping device comprises contacting the metal base to a side portion and a top portion of the substrate, such that a charge conduction path is provided between the substrate and the metal base.

* * * * *